United States Patent [19]
Yoshida et al.

[11] 4,137,475
[45] Jan. 30, 1979

[54] THIN FILM, THERMOPLASTIC PIEZOELECTRIC SWITCHES

[75] Inventors: Masafumi Yoshida; Naohiro Murayama, both of Iwaki, Japan

[73] Assignee: Kureha Kagaku Kogyo Kabushiki Kaisha, Tokyo, Japan

[21] Appl. No.: 835,925

[22] Filed: Sep. 23, 1977

Related U.S. Application Data

[63] Continuation-in-part of Ser. No. 680,993, Apr. 28, 1976, abandoned.

[30] Foreign Application Priority Data

Apr. 28, 1975 [JP] Japan .................................. 50-778

[51] Int. Cl.² ............................................ H01L 41/10
[52] U.S. Cl. ................................... 310/323; 310/326; 310/339; 310/800
[58] Field of Search ............... 310/321, 322, 323, 324, 310/326, 327, 334, 339, 800

[56] References Cited

U.S. PATENT DOCUMENTS

| | | | |
|---|---|---|---|
| 3,321,648 | 5/1967 | Kolm | 310/326 X |
| 3,749,947 | 7/1923 | Kawada et al. | 310/323 X |
| 3,843,898 | 10/1974 | Maciag | 310/326 |
| 3,935,485 | 1/1976 | Yoshida et al. | 310/800 X |
| 3,986,061 | 10/1976 | Suzuki et al. | 310/339 |

*Primary Examiner*—Mark O. Budd
*Attorney, Agent, or Firm*—Sughrue, Rothwell, Mion, Zinn and Macpeak

[57] ABSTRACT

A piezoelectric switch is disclosed for providing a continuous output in response to a contact pressure. An oscillator is brought into contact with a thermoplastic piezoelectric film, having electrodes on both surfaces thereof, via an elastic wave absorbing member. The oscillations cause constantly changing stress in the film, resulting in a constantly varying electric field between the electrodes. The magnitude of the electric field depends on the contact pressure between the oscillator and the piezoelectric element.

3 Claims, 2 Drawing Figures

THIN FILM, THERMOPLASTIC PIEZOELECTRIC SWITCHES

CROSS-REFERENCE TO RELATED APPLICATIONS

This application is a Continuation-in-Part application of Ser. No. 680,993, filed Apr. 28, 1976, now abandoned.

BACKGROUND OF THE INVENTION

The invention relates to piezoelectric switches.

It is well known in the art that an oriented polyrmethyl glutamate film or a polar thermoplastic film such as a polyvinylidene fluoride or polyvinyl fluoride film which is polarized under a high d.c. voltage electric field, has a high piezoelectric property. Piezoelectric switches, which comprise a piezoelectric thermoplastic film element with electrodes attached to both surfaces thereof, are subjected to a stress to produce a piezoelectric field for a switching operation. Such switches are disclosed in Japanese Opened Patent Application No. 47-37244.

In such conventional piezoelectric switches, the electric field is temporarily obtained only at the moment when the stress is applied to or removed from the piezoelectric film element, and is not held permanently. Further, the resulting electric field is indicated as a differential value according to changes in stress. Accordingly, the conventional piezoelectric switches cannot be used as switches for remove sensors which require an absolute value.

U.S. Pat. No. 3,935,485 to Yoshida et al describes a piezoelectric switch utilizing a thermoplastic film element. The switch shown is an example of the conventional piezoelectric switches mentioned above. Only a momentary output signal can be obtained by a single push operation since the film element is defined by a push button.

It is also known in the prior art to provide a piezoelectric switching system wherein a mechanical oscillator is brought into contact with an inorganic piezoelectric element for providing a continuous electrical output. U.S. Pat. No. 3,749,947 to Kawata et al describes an example of such a piezoelectric switching system. In this case, when a push button is actuated to bring the mechanical oscillating element into contact with the inorganic piezoelectric element, a continuous electric signal is provided between the electrodes. In FIGS. 2 and 4 of the Kawata et al patent there is shown a piezoelectric switching system wherein a driving element 13 which is a mechanical piezoelectric transducer is attached to a resonating member 14. The intermediate points of the resonating member are brought into contact with the inorganic piezoelectric members 4A through 4N by means of a push button to individually actuate the latter piezoelectric transducers.

SUMMARY OF THE INVENTION

In accordance with this invention, there is provided an analog operation switch comprising a piezoelectric thermoplastic film element with electrodes attached to both surfaces, an oscillator provided in the vicinity of the film element, and an elastic wave absorbing means intermediate thereto. Either the film element, the oscillator or the intermediate member is adapted to move into and out of a position whereby the oscillator, the film element and the absorbing means are in contact, with a contact pressure so as to produce an oscillating piezoelectric field between the electrodes in accordance with changes in the contact pressure.

DETAILED DESCRIPTION OF THE DRAWINGS

Figure 1:
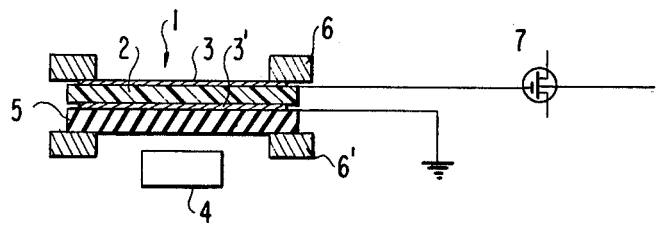
FIGS. 1 and 2 are schematic views showing first and second embodiments, respectively, of the piezoelectric switch according to this invention.

FIG. 1 shows a piezoelectric thermoplastic film element 1 which includes a polyvinylidene fluoride film 2 having a piezoelectric constant d31 on the order of, for example, $10^{-8}$ to $10^{-6}$ (Cgs esu). Attached to both surfaces of the film 2 are thin film electrodes 3,3' of gold, silver, aluminum, tin, nickel, or other suitable metals. The thin film electrodes are attached to the film 2 by means of any suitable process, such as, metal plating, sputtering, adhering, printing, or the like. The reference numeral 4 indicates an oscillator for producing mechanical oscillations such as, for example, a piezoelectric vibrator such as a bimorph piezoelectric inorganic element, an electromagnetically vibrated magnetic element, or any other well known vibrator which normally oscillates with a constant wave length and a constant strength.

The elastically absorbing means 5 is made of a material such as rubber or plastics and serves to protect the thin film thermoplastic piezoelectric element as well as the electrodes attached thereto from breaking and also serves to prevent electrical noise due to air vibrations. The material used will not completely absorb the elastic waves produced by the mechanical oscillator 4. If it were to do so, the device would not be operative. On the other hand, some of the elastic waves produced by the mechanical oscillator 4 are absorbed for the purpose of protecting against breakage as described above. Additionally, when the mechanical oscillator 4 is oscillating, even though it is not in contact with the thin film thermoplastic piezoelectric element, it will nonetheless produce vibrations in the air. The thin film thermoplastic piezoelectric elements are extremely sensitive and can respond to the vibrations in the air caused by the oscillator 4 to provide an output, which will be classified as electrical noise. It has been found by applicants that the use of an absorbing means 5 as shown can avoid the occurrence of electrical noise due to air vibrations by effectively shielding the air vibrations caused by the oscillator. The piezoelectric film element 1 and the absorbing member 5 are held between two frames 6,6'. The member 5 may be attached or coated on the surface of the electrode attached to the piezoelectric film element. An amplifier 7, such as a field effect transistor (FET), is connected to electrode 3, and the electrode 3' is grounded.

When the piezoelectric film element spanned between the frames moves, together with the frame, into contact with the oscillator 4, the oscillation from the oscillator 4 is applied to the piezoelectric film element 1 to oscillate it so as to induce piezoelectric fluctuations on the surface thereof in accordance with the oscillations therebetween. Accordingly, an analog signal can be produced in the electric circuit electrically coupled to the electrodes in accordance with the strength of the contact pressure. Instead of moving the piezoelectric film element 1 and the frames 6,6' towards the oscillator as mentioned above, the oscillator may be moved towards the film element 1 to accomplish the same result.

Figure 2:
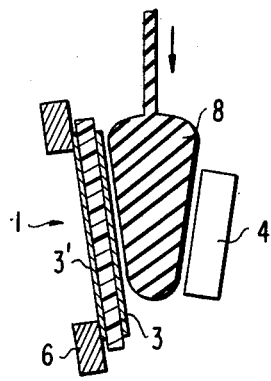

FIG. 2 shows another embodiment of this invention in which the piezoelectric thermoplastic film element 1 is attached to one face of the frame 6, and the frame 6 and the oscillator 4 are fixed relative to one another. The reference numeral 8 indicates a contact element which may be the elastic wave absorbing member or may simply be a non-elastic contact element. It will be noted that in the latter case the elastic wave absorbing means 5, as shown in FIG. 1, would have to be provided also in FIG. 2. However, according to the illustration of FIG. 2, the contacting element 8 is also the elastic wave absorbing means inasmuch as it is constructed of an elastic material such as rubber or plastic. When the contact element 8 moves downwards into contact with both the film element 1 and the oscillator 4 with a contact pressure, the oscillation from the oscillator 4 is transmitted to the film element 1 so as to produce an oscillating piezoelectric field between the electrodes 3 and 3' in accordance with the strength of the contact pressure.

Also in the case shown in FIG. 2, it is possible to prevent a direct transmission of sound wave generated by the oscillator 4 to the electrode 3 from occurring by making the contact element 8 to always exist between the oscillator 4 and the film element 1 so as to act as a shelter for sound wave. This effect may be improved by coating the electrode 3 and/or the oscillator 4 with an elastic wave absorbing material (not shown) which is different from the material forming the electrode 3 and/or the oscillator.

Since the piezoelectric field produced by the switch of this invention oscillates with the same periodic time as the oscillation from the oscillator, the respective switch positions in a multi-switch apparatus can be separately indicated by arranging each switch to have a different oscillating frequency. Further, since the piezoelectric field continues during the time when the oscillator is held in a direct or indirect contact with the film element, the switch produces a continuous signal and is useful as a switch for producing an electric signal for a prolonged or short time.

What is claimed is:

1. A piezoelectric switch comprising a thin film thermoplastic piezoelectric element with electrodes attached to both surfaces thereof, and an oscillator positioned in the vicinity of said element for providing mechanical oscillating energy, at least one of the piezoelectric element and oscillator being movable to a position relative to the other to cause said oscillating energy to be applied to said piezoelectric element with a pressure so as to produce an oscillating piezoelectric field between the electrodes in accordance with changes in the strength of the contact pressure, and an elastic wave absorbing means separate from said oscillator and positioned between said oscillator and said piezoelectric element, said oscillating energy being applied to said piezoelectric element via said absorbing means when both said piezoelectric element and said oscillator are in contact with said absorbing means and said absorbing means absorbing vibrations of the air between said oscillator and said piezoelectric element when either said piezoelectric element or said oscillator are not in contact with said absorbing means.

2. A piezoelectric switch as claimed in claim 1 wherein said absorbing means is fixedly attached to said piezoelectric element and is brought into and out of contact with said oscillator.

3. A piezoelectric switch comprising a thin film thermoplastic piezoelectric element with electrodes attached to both surfaces thereof, an oscillator positioned in the vicinity of said element for providing mechanical oscillating energy and an elastic wave absorbing contact element movable into and out of simultaneous contact with both said piezoelectric element and said oscillator to bring said piezoelectric element and oscillator into indirect contact with each other at a contact pressure so as to produce an oscillating piezoelectric field between said electrodes in accordance with changes in the strength of the contact pressure.

* * * * *

UNITED STATES PATENT AND TRADEMARK OFFICE
CERTIFICATE OF CORRECTION

PATENT NO. : 4,137,475
DATED     : January 30, 1979
INVENTOR(S) : Masafumi YOSHIDA et al It is certified that error appears in the above-identified patent and that said Letters Patent are hereby corrected as shown below:

IN THE HEADING:

Foreign Application Priority Data:

Delete "50-778" insert -- 50-50778 --

*Signed and Sealed this*

*Twenty-ninth* Day of *May 1979*

[SEAL]

Attest:

RUTH C. MASON
*Attesting Officer*

DONALD W. BANNER
*Commissioner of Patents and Trademarks*